US010041169B2

(12) United States Patent
Lindfors

(10) Patent No.: US 10,041,169 B2
(45) Date of Patent: Aug. 7, 2018

(54) SYSTEM AND METHOD FOR LOADING A SUBSTRATE HOLDER CARRYING A BATCH OF VERTICALLY PLACED SUBSTRATES INTO AN ATOMIC LAYER DEPOSITION REACTOR

(75) Inventor: Sven Lindfors, Espoo (FI)

(73) Assignee: Picosun Oy, Espoo (FI)

( * ) Notice: Subject to any disclaimer, the term of this patent is extended or adjusted under 35 U.S.C. 154(b) by 1422 days.

(21) Appl. No.: 12/154,879

(22) Filed: May 27, 2008

(65) Prior Publication Data

US 2009/0297710 A1    Dec. 3, 2009

(51) Int. Cl.
| | | |
|---|---|---|
| *C30B 25/12* | (2006.01) |
| *C23C 16/40* | (2006.01) |
| *C23C 16/455* | (2006.01) |
| *C30B 25/16* | (2006.01) |
| *C30B 29/20* | (2006.01) |

(52) U.S. Cl.
CPC ...... *C23C 16/403* (2013.01); *C23C 16/45504* (2013.01); *C23C 16/45546* (2013.01); *C30B 25/165* (2013.01); *C30B 29/20* (2013.01)

(58) Field of Classification Search
CPC ......... C30B 25/00; C30B 25/02; C30B 25/12; C30B 25/14; C30B 25/16; C30B 25/165; C30B 29/00; C30B 29/10; C30B 29/16; C30B 29/20; C23C 16/403; C23C 16/45504; C23C 16/45546
USPC ..... 117/84, 88, 93, 200, 101–102, 204, 902, 117/911, 937, 950
See application file for complete search history.

(56) References Cited

U.S. PATENT DOCUMENTS

| | | | | |
|---|---|---|---|---|
| 4,582,720 | A | * | 4/1986 | Yamazaki ............. C23C 16/505 118/723 E |
| 5,037,775 | A | * | 8/1991 | Reisman ................. C23C 16/04 117/93 |
| 5,674,039 | A | | 10/1997 | Walker et al. ........... 414/222.05 |
| 5,799,995 | A | | 9/1998 | Bergam et al. .............. 294/27.1 |
| 6,050,446 | A | | 4/2000 | Lei et al. ...................... 220/819 |
| 6,145,397 | A | | 11/2000 | Nzeadibe et al. ............. 74/97.1 |
| 6,395,101 | B1 | | 5/2002 | Scranton et al. ............... 134/32 |
| 6,413,355 | B1 | | 7/2002 | Kamikawa et al. ..... 156/345.11 |
| 6,517,634 | B2 | | 2/2003 | Pang et al. .................... 118/715 |
| 6,585,823 | B1 | | 7/2003 | Van Wijck ...................... 117/89 |

(Continued)

FOREIGN PATENT DOCUMENTS

| | | | |
|---|---|---|---|
| JP | 61-251118 | * | 11/1986 |
| JP | 2001240972 A | | 9/2001 |

(Continued)

OTHER PUBLICATIONS

Owyang, J., "Innovations in Batch ALD", Verano RVP-5500, Jul. 17, 2007, 15 pgs.

(Continued)

*Primary Examiner* — Kenneth A Bratland, Jr.
(74) *Attorney, Agent, or Firm* — Ziegler IP Law Group, LLC

(57) ABSTRACT

The invention relates to methods and apparatus in which precursor vapor is guided along at least one in-feed line into a reaction chamber of a deposition reactor, and material is deposited on surfaces of a batch of vertically placed substrates by establishing a vertical flow of precursor vapor in the reaction chamber and having it enter in a vertical direction in between said vertically placed substrates.

20 Claims, 12 Drawing Sheets

(56) References Cited

U.S. PATENT DOCUMENTS

| | | | |
|---|---|---|---|
| 6,648,974 B1 | 11/2003 | Ogliari et al. | 118/719 |
| 6,719,851 B1 | 4/2004 | Kurita et al. | 134/8 |
| 6,835,416 B2 | 12/2004 | Kilpi | 427/255.28 |
| 6,846,149 B2 | 1/2005 | Savage et al. | 414/416 |
| 6,905,549 B2 | 6/2005 | Okuda et al. | 118/715 |
| 6,916,374 B2 * | 7/2005 | Sandhu | C23C 16/45546 117/101 |
| 7,002,134 B2 | 2/2006 | Chu et al. | 250/221 |
| 7,022,181 B2 * | 4/2006 | Nakagawa | C30B 19/00 117/54 |
| 7,022,184 B2 | 4/2006 | Van Wijck | 117/201 |
| 7,112,544 B2 | 9/2006 | Doan et al. | 438/791 |
| 7,654,221 B2 | 2/2010 | Lubomirsky et al. | 118/52 |
| 7,798,096 B2 * | 9/2010 | Mahajani | C23C 16/45508 118/723 E |
| 2001/0014371 A1 * | 8/2001 | Kilpi | C23C 16/45525 427/255.28 |
| 2002/0064440 A1 | 5/2002 | Ikeda et al. | 414/222.01 |
| 2002/0108570 A1 * | 8/2002 | Lindfors | C23C 16/405 118/715 |
| 2004/0007581 A1 | 1/2004 | Nguyen et al. | 220/819 |
| 2004/0018122 A1 | 1/2004 | Micklash et al. | 422/130 |
| 2004/0065258 A1 | 4/2004 | Sandhu et al. | 118/722 |
| 2005/0183664 A1 | 8/2005 | Hwang et al. | 118/715 |
| 2005/0186338 A1 | 8/2005 | Roscheisen et al. | 427/248.1 |
| 2005/0211167 A1 * | 9/2005 | Gunji | C23C 16/44 118/715 |
| 2006/0156979 A1 | 7/2006 | Thakur et al. | 118/715 |
| 2006/0196418 A1 * | 9/2006 | Lindfors | C23C 16/45525 118/715 |
| 2008/0213479 A1 * | 9/2008 | Chou | C23C 16/36 427/255.393 |
| 2010/0028122 A1 | 2/2010 | Lindfors | 414/806 |

FOREIGN PATENT DOCUMENTS

| | | |
|---|---|---|
| SU | 954513 | 8/1982 |
| WO | WO 2005/021831 A1 | 3/2000 |
| WO | WO-2009/144371 A1 | 12/2009 |

OTHER PUBLICATIONS

Puurunen, R.L., "Surface Chemistry of Atomic Layer Deposition: a case study for the trimethyaluminum/water process" Mar. 18, 2005, J. Appl. Phys., 97, 55 pgs.

* cited by examiner

SYSTEM AND METHOD FOR LOADING A SUBSTRATE HOLDER CARRYING A BATCH OF VERTICALLY PLACED SUBSTRATES INTO AN ATOMIC LAYER DEPOSITION REACTOR

FIELD OF THE INVENTION

The present invention generally relates to apparatus and methods for deposition reactors. More particularly, but not exclusively, the invention relates to apparatus and methods for such deposition reactors in which material is deposited on surfaces by sequential self-saturating surface reactions.

BACKGROUND OF THE INVENTION

Atomic Layer Epitaxy (ALE) method was invented by Dr. Tuomo Suntola in the early 1970's. Another generic name for the method is Atomic Layer Deposition (ALD) and it is nowadays used instead of ALE. ALD is a special chemical deposition method based on the sequential introduction of at least two reactive precursor species to a substrate that is located within a heated reaction space. The growth mechanism of ALD relies on the bond strength differences between chemical adsorption (chemisorption) and physical adsorption (physisorption). ALD utilizes chemisorption and eliminates physisorption during the deposition process. During chemisorption a strong chemical bond is formed between atom(s) of a solid phase surface and a molecule that is arriving from the gas phase. Bonding by physisorption is much weaker because only van der Waals forces are involved. Physisorption bonds are easily broken by thermal energy when the local temperature is above the condensation temperature of the molecules.

By definition the reaction space of an ALD reactor comprises all the heated surfaces that can be exposed alternately and sequentially to each of the ALD precursor used for the deposition of thin films. A basic ALD deposition cycle consists of four sequential steps: pulse A, purge A, pulse B and purge B. Pulse A typically consists of metal precursor vapor and pulse B of non-metal precursor vapor, especially nitrogen or oxygen precursor vapor. Inactive gas, such as nitrogen or argon, and a vacuum pump are used for purging gaseous reaction by-products and the residual reactant molecules from the reaction space during purge A and purge B. A deposition sequence comprises at least one deposition cycle. Deposition cycles are repeated until the deposition sequence has produced a thin film of desired thickness.

Precursor species form through chemisorption a chemical bond to reactive sites of the heated surfaces. Conditions are typically arranged in such a way that no more than a molecular monolayer of a solid material forms on the surfaces during one precursor pulse. The growth process is thus self-terminating or saturative. For example, the first precursor can include ligands that remain attached to the adsorbed species and saturate the surface, which prevents further chemisorption. Reaction space temperature is maintained above condensation temperatures and below thermal decomposition temperatures of the utilized precursors such that the precursor molecule species chemisorb on the substrate(s) essentially intact. Essentially intact means that volatile ligands may come off the precursor molecule when the precursor molecules species chemisorb on the surface. The surface becomes essentially saturated with the first type of reactive sites, i.e. adsorbed species of the first precursor molecules. This chemisorption step is typically followed by a first purge step (purge A) wherein the excess first precursor and possible reaction by-products are removed from the reaction space. Second precursor vapor is then introduced into the reaction space. Second precursor molecules typically react with the adsorbed species of the first precursor molecules, thereby forming the desired thin film material. This growth terminates once the entire amount of the adsorbed first precursor has been consumed and the surface has essentially been saturated with the second type of reactive sites. The excess of second precursor vapor and possible reaction by-product vapors are then removed by a second purge step (purge B). The cycle is then repeated until the film has grown to a desired thickness. Deposition cycles can also be more complex. For example, the cycles can include three or more reactant vapor pulses separated by purging steps. All these deposition cycles form a timed deposition sequence that is controlled by a logic unit or a microprocessor.

Thin films grown by ALD are dense, pinhole free and have uniform thickness. For example, aluminum oxide grown from trimethylaluminum $(CH_3)_3Al$, also referred to as TMA, and water at 250-300° C. has usually about 1% non-uniformity over the 100-200 mm wafer. Metal oxide thin films grown by ALD are suitable for gate dielectrics, electroluminescent display insulators, capacitor dielectrics and passivation layers. Metal nitride thin films grown by ALD are suitable for diffusion barriers, e.g., in dual damascene structures.

Precursors suitable for ALD processes in various ALD reactors are disclosed, for example, in review article R. Puurunen, "*Surface chemistry of atomic layer deposition: A case study for the trimethylaluminium/water process*", J. Appl. Phys., 97 (2005), p. 121301, which is incorporated herein by reference.

In a typical reactor, ALD deposition cycles are applied to a single wafer or substrate. While this kind of single wafer processing may be satisfactory for an R&D purpose, it does not meet, e.g., the requirements of affordable mass production, such as the through-put of the product or mean time between service.

SUMMARY

It is an object of the present invention to provide apparatus and methods suitable for growing material on the surfaces of a batch of wafers or substrates in a batch reactor.

According to a first aspect of the invention there is provided a method comprising:

guiding precursor vapor along at least one in-feed line into a reaction chamber of a deposition reactor; and depositing material on surfaces of a batch of vertically placed substrates in the reaction chamber by establishing a vertical flow of precursor vapor in the reaction chamber and having it enter in a vertical direction in between said vertically placed substrates.

Certain embodiments of the invention provide a novel gas flow geometry within the apparatus and a robust substrate handling system.

In certain embodiments, the direction of said vertical flow is from top to bottom. In an embodiment, the vertically placed substrates form in a substrate holder a horizontal stack of vertically placed substrates with a uniform horizontal spacing.

In certain embodiments, said batch of vertically placed substrates comprises a set of wafers placed in parallel into a movable substrate holder, and wherein said set of wafers comprises at least two wafers. In certain embodiments, the number of substrates or wafers is much more than two, for example, about five, ten, twenty, twenty-five or more, in some embodiment in the range of 8-25, in some other embodiment even more. The substrates may be semiconductor wafers, such as silicon wafers, for example 3-12" wafers. In certain embodiments, the substrates may be ceramic pieces or plates, such as batch of piezoelectric monoliths. In certain embodiments, the substrates may comprise metallic pieces with various geometries, such as metal spheres.

In certain embodiments, said substrate holder is attached to a movable reaction chamber lid. In certain embodiments, precursor vapor is fed into the reaction chamber via the reaction chamber lid.

In certain embodiments, precursor vapor is guided via the reaction chamber lid into an expansion volume and from the expansion volume in a vertical direction through a distribution plate into a part of the reaction chamber containing said substrates.

In certain embodiment, the reaction chamber size is specifically optimized for the size of the batch of vertically placed substrates or for the size of a substrate holder carrying said substrates. In this way savings in the precursor consumption are obtainable. In certain embodiments, the size of the reaction chamber can be adjusted, for example, with a fitting part or by replacing a reaction chamber body.

According to a second aspect of the invention there is provided an apparatus comprising:

at least one in-feed line configured for feeding precursor vapor into a reaction chamber of a deposition reactor; and said reaction chamber configured for depositing material on surfaces of a batch of vertically placed substrates in the reaction chamber by establishing a vertical flow of precursor vapor in the reaction chamber and having it enter in a vertical direction in between said vertically placed substrates.

In certain embodiments, the apparatus comprises a stationary reaction chamber body and a movable reaction chamber lid capable of housing a substrate holder for multiple substrates.

In certain embodiments, the batch is accessible from the top side of the reactor.

The methods and apparatus may be intended for growing material or thin films on heated surfaces by sequential self-saturating surface reactions below the atmospheric pressure. The apparatus may be an ALD (Atomic Layer Deposition) or ALE (Atomic Layer Epitaxy) apparatus or similar. The desired thickness of the thin films would typically be in the area extending from one monolayer or molecular layer up to 1000 nm or further.

Various exemplary embodiments of the present invention are illustrated hereinafter in the detailed description of the invention as well as in the dependent claims appended hereto. The embodiments are illustrated with reference to selected aspects of the invention. A person skilled in the art appreciates that any embodiment of the invention may be combined with other embodiment(s) within the same aspect. Furthermore, any embodiment may apply to other aspects as well either alone or in combination with other embodiment(s).

BRIEF DESCRIPTION OF THE DRAWINGS

The invention will now be described, by way of example only, with reference to the accompanying drawings, in which.

DETAILED DESCRIPTION

In the following description, Atomic Layer Deposition (ALD) technology is used as an example. The purpose, however, is not to strictly limit to that technology but it has to be recognized that certain embodiments may be applicable also in methods and apparatus utilizing other comparable atomic-scale deposition technologies.

The basics of an ALD growth mechanism are known to a skilled person. Details of ALD methods have also been described in the introductory portion of this patent application. These details are not repeated here but a reference is made to the introductory portion with that respect.

Figure 1:
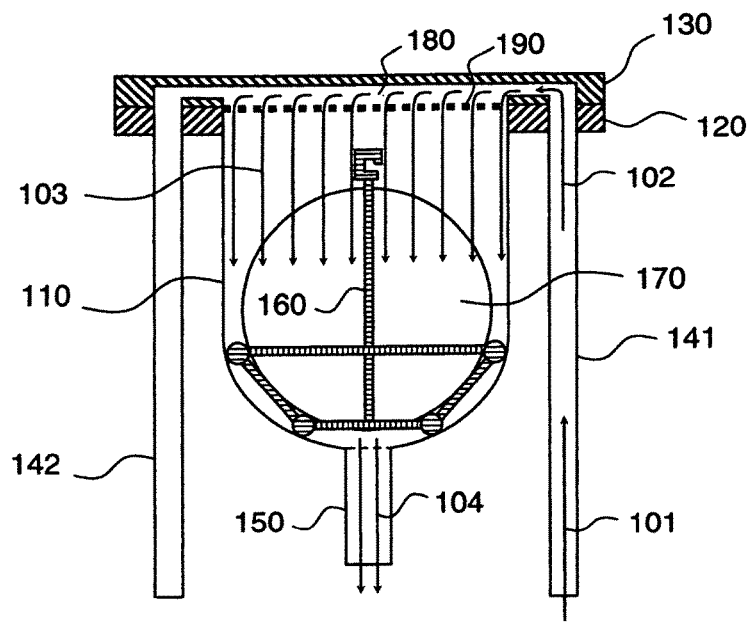
FIG. 1 shows a cross-sectional view of reaction chamber of a deposition reactor with an in-feed line and exhaust line in accordance with an embodiment.

FIG. 1 shows certain details of an ALD apparatus (or reactor) in a cross-sectional view. The apparatus comprises a reaction chamber formed by a reaction chamber body 110, reaction chamber top flange 120, and reaction chamber lid 130. The apparatus further comprises reaction chamber in-feed lines 141, 142 and a reaction chamber exhaust guide 150. The number of in-feed lines may vary depending on the implementation.

A substrate holder 160 has been lowered onto the bottom of the reaction chamber. The substrate holder 160 carries a batch of vertically placed substrates or wafers 170.

During a precursor vapor pulse period, precursor vapor flows along an in-feed line 141 (as indicated by arrow 101) in a vertical direction into the reaction chamber lid 130 from the downside via a channel machined through the top flange 120. The flow makes a 90 degrees turn (as indicated by arrow 102) in the lid 130 and enters in a horizontal direction a space above the substrates 170 via a horizontal conduit. (The turn, however, does not necessarily need to be 90 degrees.) This space can be denoted as an expansion volume 180. Below the expansion volume 180 the apparatus comprises a distribution part (or plate) 190 which may be, for example, a mesh or perforated plate and may be attached to the lid 130. The flow makes another turn in the expansion volume 180 and enters in a vertical top-to-bottom direction through the distribution part into the reaction space of the reaction chamber (as indicated by arrows 103). In the reaction space the precursor vapor enters in a vertical direction in between the vertically placed substrates 170. In the intermediate space between substrates 170 the precursor flow reacts with reactive sites on substrate surfaces. In an embodiment, the precursor flow goes in a vertical direction along the essentially parallel surfaces of substrates from the top side of the reaction chamber to the bottom side of the reaction chamber towards the exhaust guide 150. Reaction by-products and remaining gaseous precursor molecules are purged out from the reaction chamber in a subsequent purge step (as indicated by arrows 104).

In an embodiment the in-feed line 141 is used to feed precursor vapor of a first precursor and inactive carrier and purge gas and the in-feed line 142 is used to feed precursor vapor of a second precursor and inactive carrier and purge gas into the reaction chamber.

In an alternative embodiment, precursor vapor flows into the reaction chamber lid 130 in a horizontal direction from a side through a channel machined through the lid 130 (not shown in FIG. 1). In this embodiment, the top flange does not need to have the mentioned vertical channel. In another alternative embodiment, precursor vapor again flows in a vertical direction into the reaction chamber lid 130 from the downside, but totally passes the top flange 120. In this embodiment, the horizontal diameter of the top flange 120 can, for example, be smaller that the horizontal diameter of the lid 130 enabling the passing.

Figure 2:
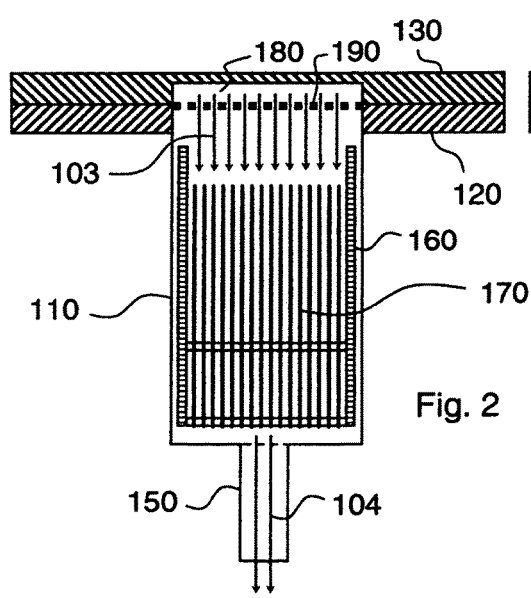
FIG. 2 shows another cross-sectional view of the reaction chamber of the deposition reactor of FIG. 1.

FIG. 2 shows another cross-sectional view of the apparatus of FIG. 1. In this figure the cross-section has been taken with a virtual plane turned by 90 degrees compared to the one of FIG. 1. If the cross-section in FIG. 1 presents a front view the cross-section in FIG. 2 may present a view from the left, for example.

The placing of substrates (or wafers) 170 in the substrate holder 160 can be better visualized in FIG. 2. The substrates 170 have been placed in a vertical position so that the surface of each substrate 170 is in a vertical plane. The substrates 170 can be located in line with each other in the substrate holder 160, and when being is said line they can be parallel to each other. The substrates 170 are supported by the substrate holder 160.

The spacing between substrates 170 is small in order to improve the efficiency of the reaction space. The spacing, however, is large enough to enable precursor flow to properly enter in between the substrates 170. In certain embodiments, substantially uniform spacing is typically selected from a range of 1-10 mm, in an embodiment from a range of 2-5 mm. In the example presented in FIGS. 1 and 2 the number of substrates in the batch is 16.

The reaction chamber size can be specifically optimized for the size of the batch of vertically placed substrates or for the size of a substrate holder carrying said substrates. In this way savings in the precursor consumption may be achieved.

In certain embodiments, the size of the reaction chamber can be adjusted, for example, with inserting a space-limiting fitting part into the reaction chamber or by replacing the reaction chamber or reaction chamber body 110 with a different size one.

Figure 3:
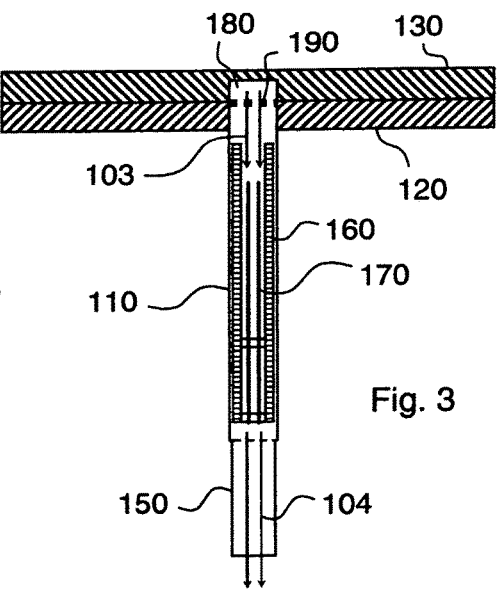
FIG. 3 shows an alternative embodiment.

FIG. 3 shows another cross-sectional view of the apparatus of FIG. 1 in another embodiment. In this embodiment, the reaction chamber is a thin reaction chamber comprising a thin substrate holder 160 with a smaller amount of substrates 170. The number of substrates in this embodiment is two. The thin reactor presented in FIG. 3 has been obtained, for example, by replacing the larger (or normal size) reaction chamber shown in FIG. 2 with a thinner one.

In both apparatus presented in FIG. 2 and FIG. 3, the size of the substrate holder 160 carrying the substrates 170 has been selected so that the substrate holder 160 with substrates 170 substantially fills the bottom part of the reaction chamber. In this way, the consumption efficiency of precursors can be improved.

Figure 4:
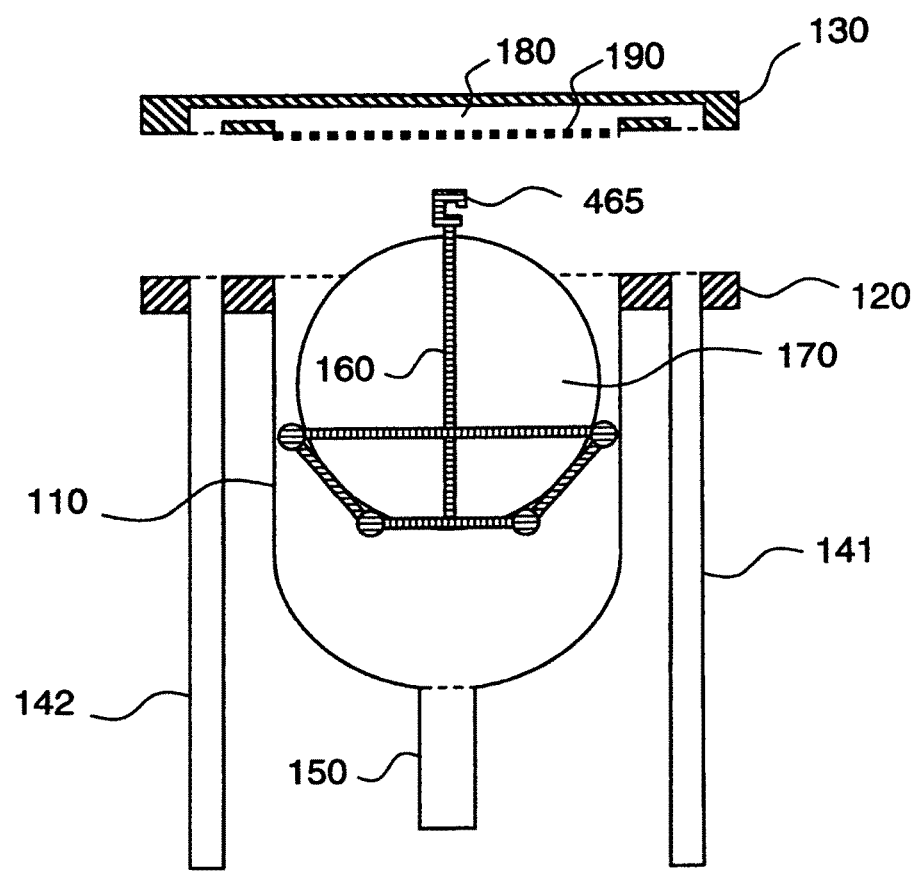
FIG. 4 shows an assembly drawing of the apparatus of FIG. 1.

FIG. 4 shows an assembly drawing of the apparatus of FIG. 1. The substrate holder 160 can be lifted from the reaction chamber or lowered into the reaction chamber by gripping on the lifting part or hook 465 with an external lifting device (not shown in FIG. 4) and moving into the desired direction. The movable reaction chamber lid 130 can be pressed against the reaction chamber top flange 120 and sealed by a tolerance or proximity seal. Tolerance seal denotes a construction where two essentially similar surfaces (such as smooth flat surfaces or flat surfaces roughened e.g. with glass bead blasting) are in close contact with each other preventing the flow of gases between the said surfaces.

The substrate holder 160 material typically comprises stainless steel, nickel, titanium, silicon carbide (e.g. SiC made from graphite by chemical vapor infiltration) or quartz. In an embodiment the substrate holder 160 is coated with an amorphous thin film (e.g. 100-200 nm of $Al_2O_3$) to protect the holder surface against corrosive source chemicals before taking the substrate holder in use.

Figure 5:
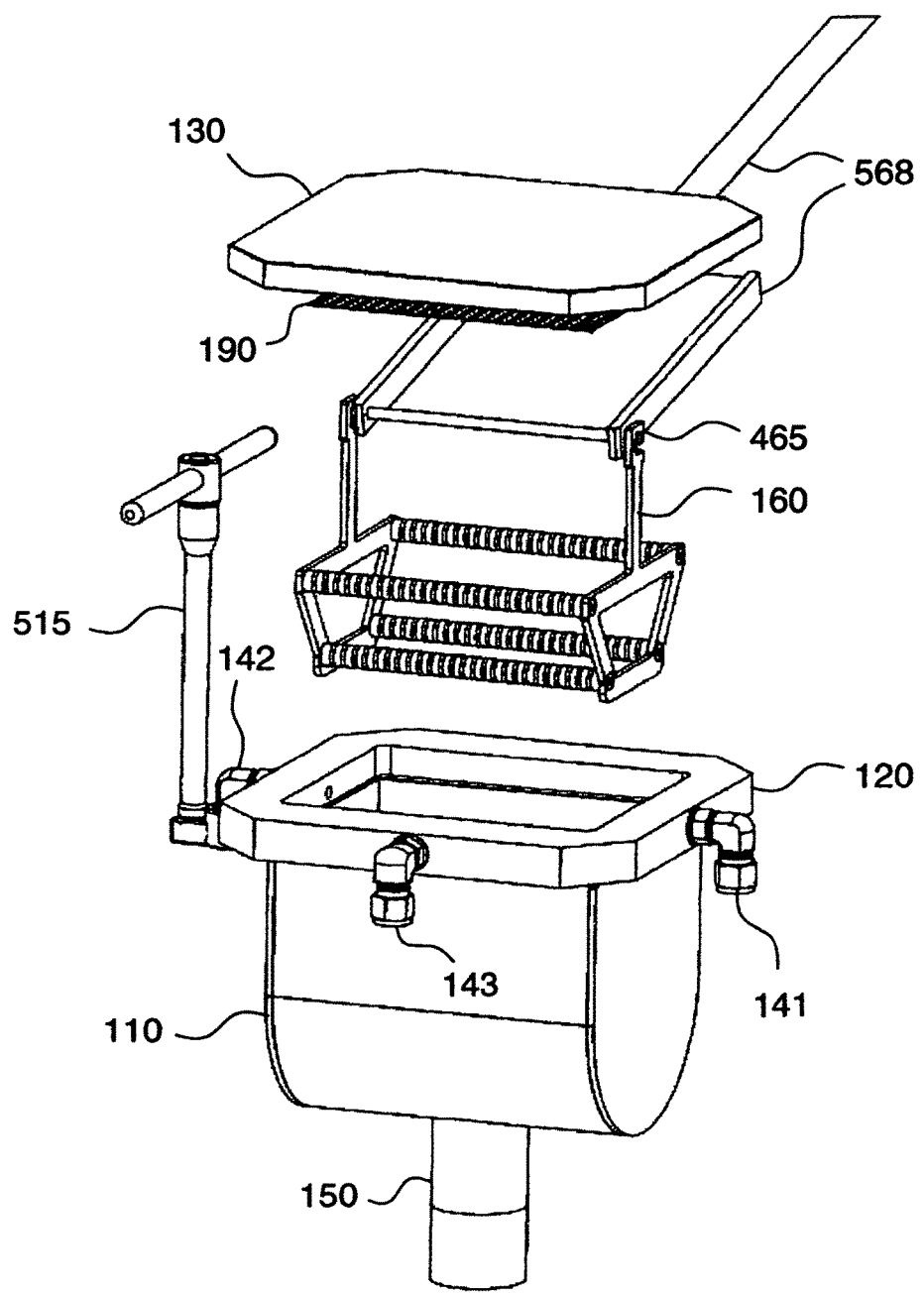
FIG. 5 shows an assembly drawing of a reaction chamber in accordance with another embodiment.

FIG. 5 shows an assembly drawing of a reaction chamber in accordance with another embodiment. In this embodiment, there are three in-feed lines 141-143 connected to a substantially rectangular reaction chamber top flange 120. The reaction chamber can be lifted from the reactor with the aid of the removable lift arm 515 for service or replacement purposes. The substrate holder 160 can be lifted from the reaction chamber or lowered into the reaction chamber by gripping on the lifting part or hook 465 with an external lifting device 568.

Figure 6:
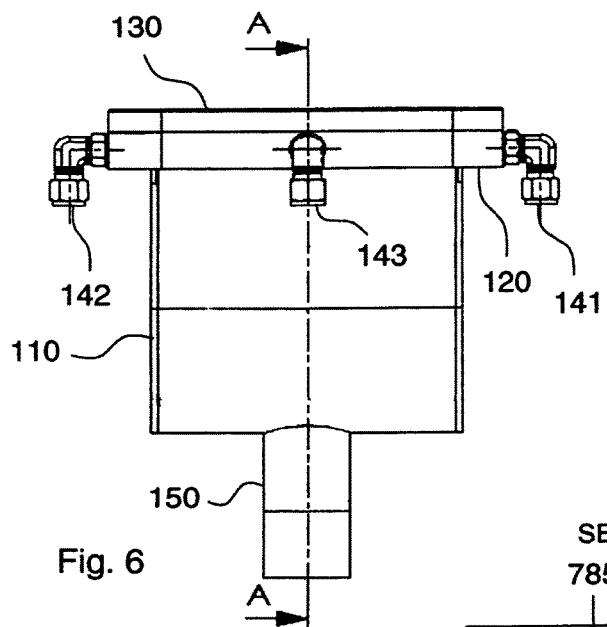
FIG. 6 shows a front view of the reaction chamber of FIG. 5.

FIG. 6 shows a front view of the reaction chamber of FIG. 5 in a default (or closed) position. Movable reaction chamber lid 130 is sealed against the reaction chamber top flange 120 with a tolerance or proximity seal.

Figure 7:
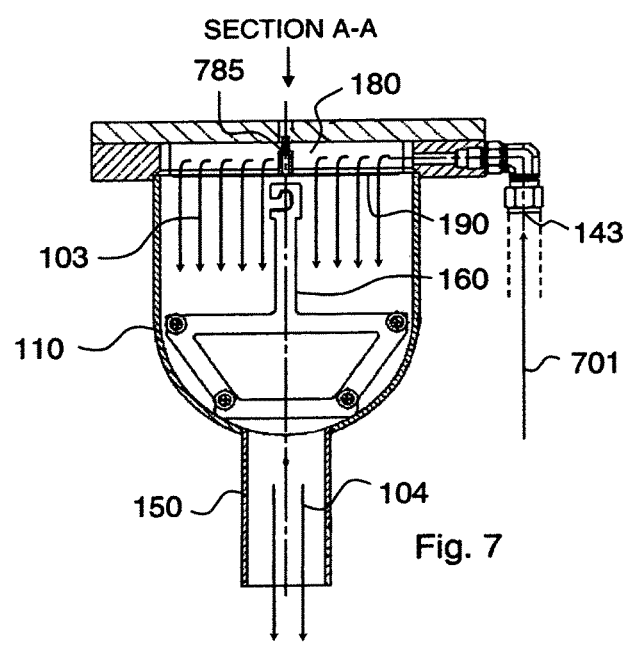
FIG. 7 shows a cross-sectional view along line A-A in FIG. 6.

FIG. 7 shows a cross-sectional view of the reaction chamber along line A-A shown in FIG. 6. During a precursor vapor pulse period, precursor vapor flows along an in-feed line 143 (as indicated by arrow 701) in a vertical direction. The flow makes a 90 degrees turn and enters in a horizontal direction the reaction chamber top flange 120 from a side. (The turn, however, does not necessarily need to be 90 degrees.) The precursor vapor flow continues along a horizontal conduit inside the top flange 120 and enters the expansion volume 180. Below the expansion volume 180 the apparatus comprises a distribution part (or plate) 190 which may be, for example, a mesh or perforated plate. The distribution part 190 is, in this embodiment, attached to the reaction chamber lid 130 with a spacer pin 785. The flow makes another turn in the expansion volume 180 and enters in a vertical top-to-bottom direction through the distribution part 190 into the reaction space of the reaction chamber (as indicated by arrows 103). In the reaction space the precursor vapor enters in a vertical direction in between the vertically placed substrates 170 carried by the substrate holder 160 (although the substrates 170 are not shown in FIG. 7). From this on the process continues similarly as described in connection with FIG. 1.

Figure 8:
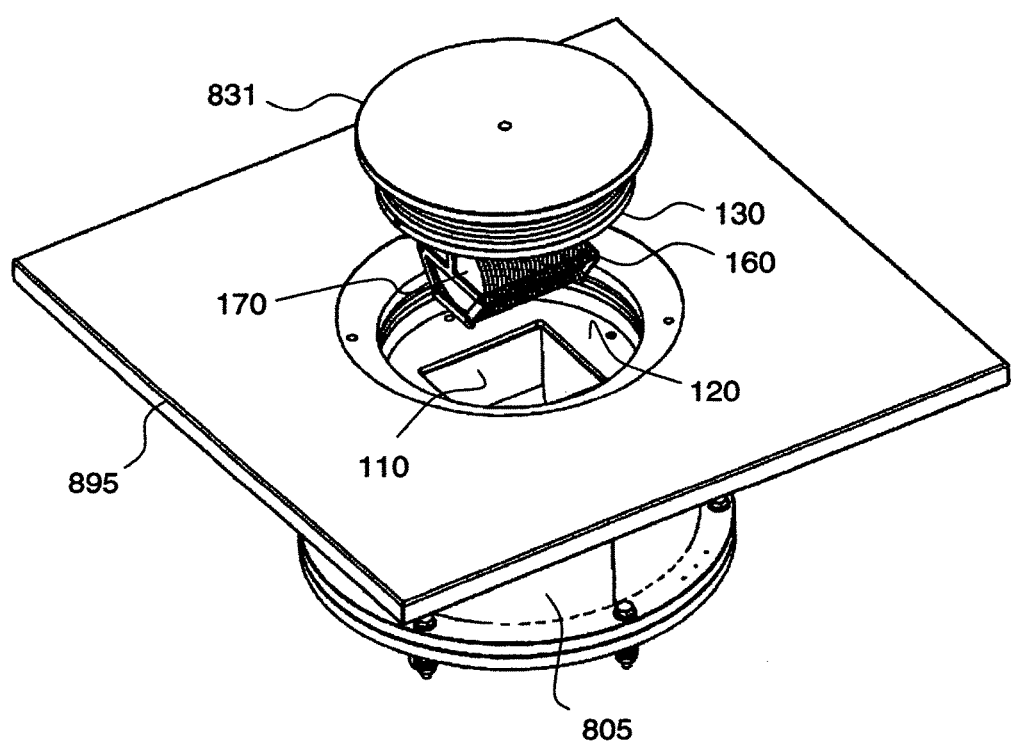
FIG. 8 shows perspective view of a deposition reactor in an open position in accordance with an embodiment.

FIG. 8 shows a perspective view of certain details of a deposition reactor in an open position in accordance with an embodiment. The reactor comprises a vacuum chamber 805 which is formed by a round fitting, e.g. ISO full nipple with flanges bolted to the nipple, or a CF fitting or similar. The width of the fitting is large enough to accommodate a reaction chamber for a batch of 100-300 mm wafers and heaters depending on the embodiment.

A vacuum chamber lid 831 is integrated with the reaction chamber lid 130 thereby forming a lid system. The substrate holder 160 carrying a batch of substrates 170, vertically placed next to each other in a horizontal line, is attached to the lid system. The reaction chamber can be loaded in a vertical direction from the top by lowering the lid system to which the substrate holder 160 with substrates 170 is attached. This can be done, for example, by a suitable loading arrangement. An apparatus cover 895 has an opening through which the lid system fits.

Figure 9:
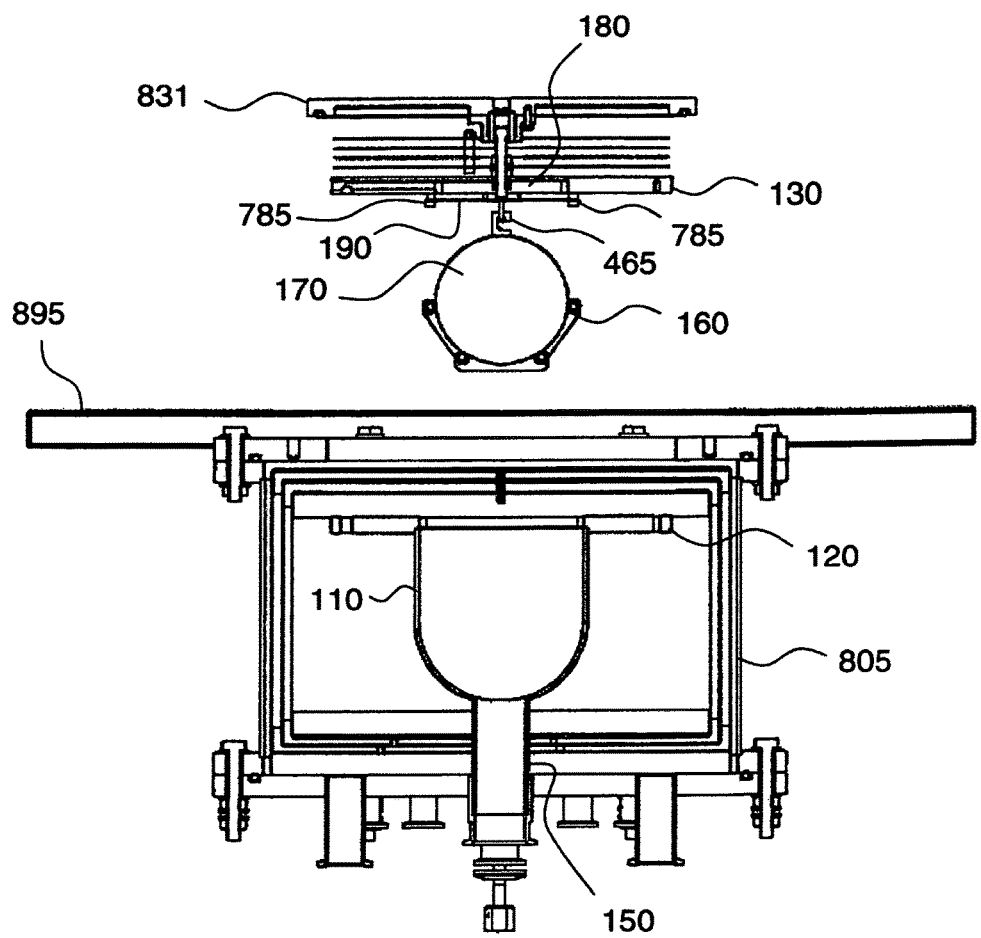
FIG. 9 shows a cross-sectional view of the deposition reactor of FIG. 8 in the open position.

FIG. 9 shows a cross-sectional view of the deposition reactor of FIG. 8 in the open position. The substrate holder 160 is attached with its top attachment part or hook 465 to a counterpart in the lid system. The distribution part 190 is attached to the lid system with spacer pins 785.

Figure 10:
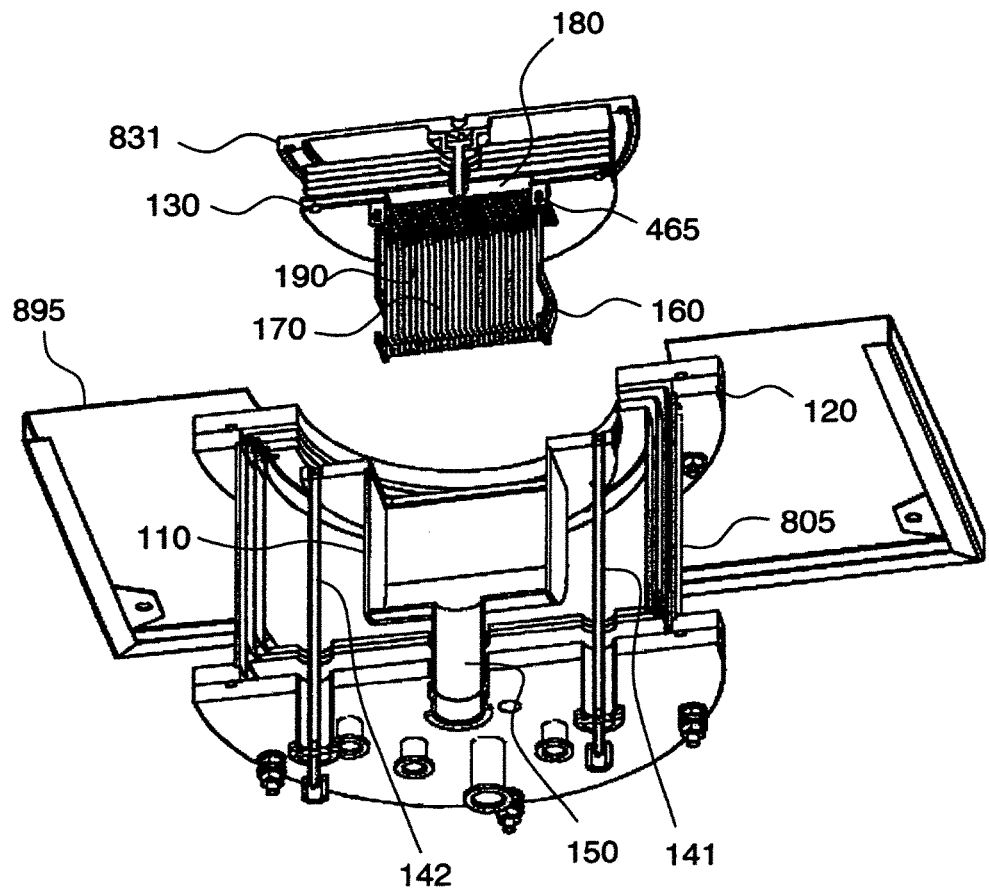
FIG. 10 shows another cross-sectional view of the deposition reactor of FIG. 8 in the open position.

FIG. 10 shows a perspective cross-sectional view of the deposition reactor of FIG. 8 in the open position. The reaction chamber in-feed lines 141, 142 are also visible in FIG. 10.

Figure 11:
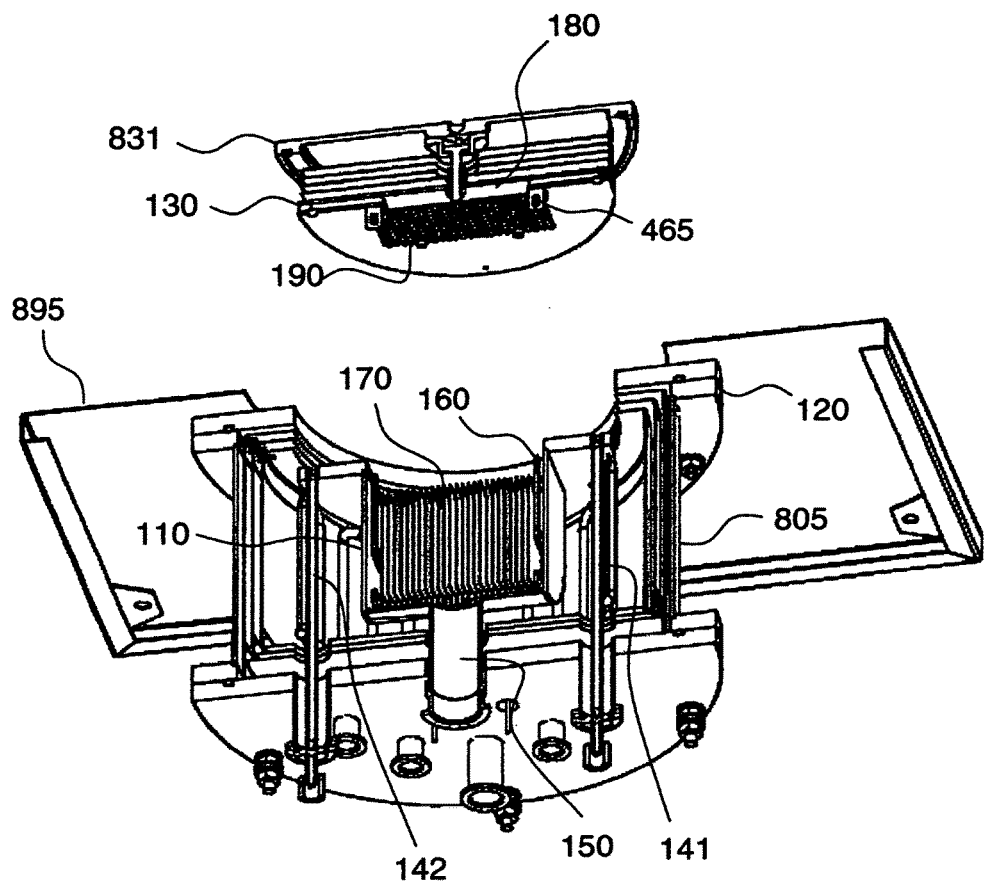
FIG. 11 shows another cross-sectional view of the deposition reactor of FIG. 8 a reactor lid in an open position and substrate holder in its place inside the reactor.

FIG. 11 shows another perspective cross-sectional view of the deposition reactor of FIG. 8 a reactor lid in an open position and substrate holder in its place inside the reaction chamber.

Figure 12:
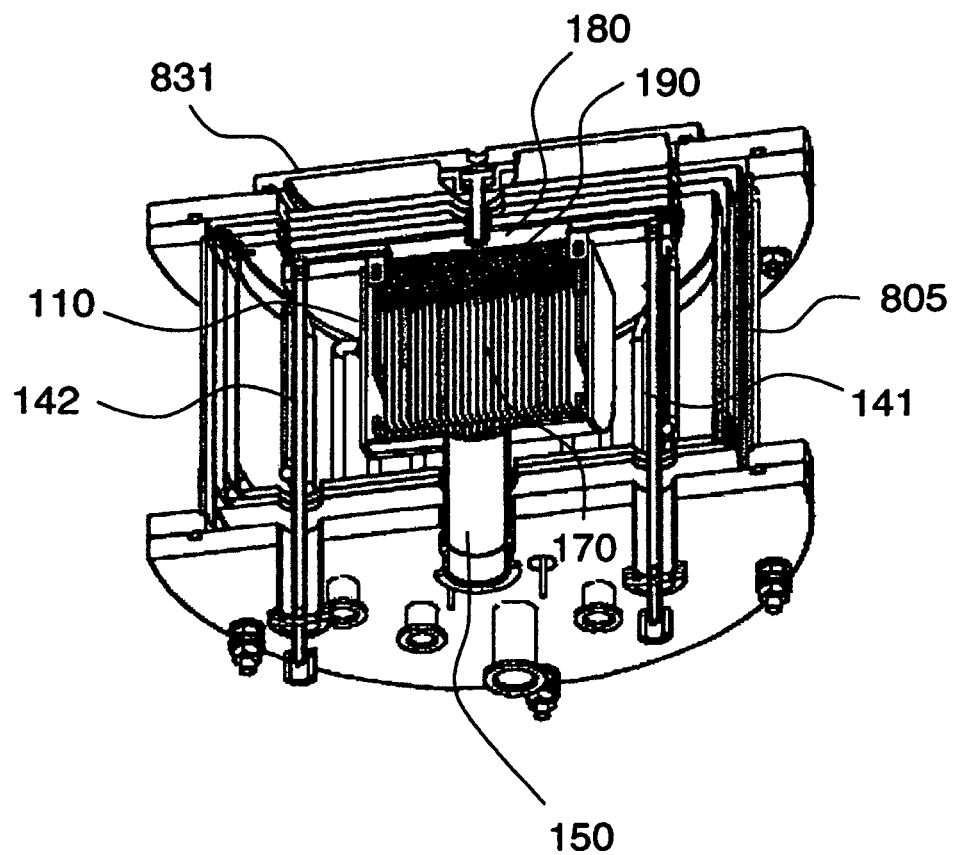
FIG. 12 shows a cross-sectional view of the deposition reactor of FIG. 8 in a default position.

FIG. 12 shows a perspective cross-sectional view of the deposition reactor of FIG. 8 in a default operating position.

Figure 13:
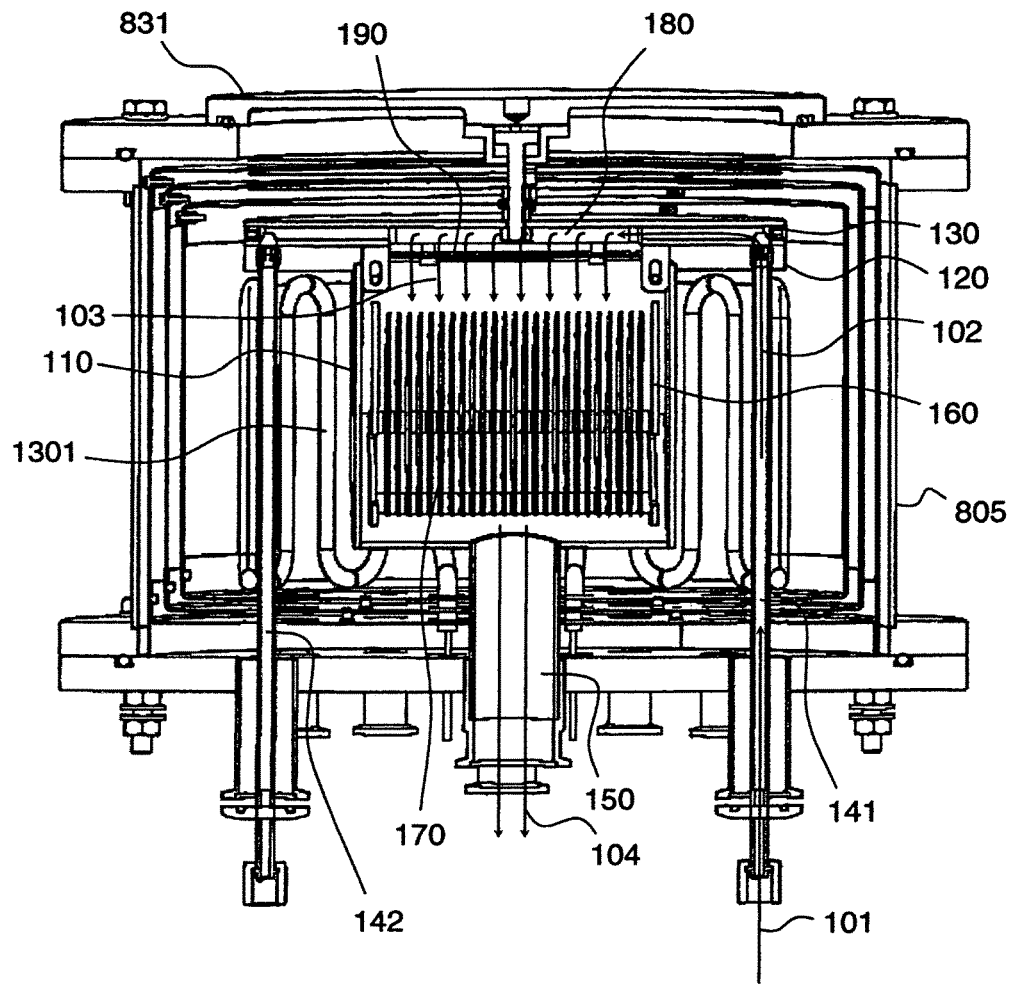
FIG. 13 shows another cross-sectional view of the deposition reactor of FIG. 8 in a default position.

FIG. 13 shows another cross-sectional view of the deposition reactor of FIG. 8 in the default operating position. In this example, the number of substrates in the batch is 25. During a precursor vapor pulse period, precursor vapor flows along an in-feed line 141 (as indicated by arrow 101) in a vertical direction into the reaction chamber lid 130 from the downside via a channel machined through the top flange 120. The flow makes a 90 degrees turn (as indicated by arrow 102) in the lid 130 and enters in a horizontal direction the expansion volume 180 above the substrates 170 via a horizontal conduit. (The turn, however, does not necessarily need to be 90 degrees.) Below the expansion volume 180 the apparatus comprises a distribution part (or plate) 190 which may be, for example, a mesh or perforated plate and may be attached to the lid 130. The flow makes another turn in the expansion volume 180 and enters in a vertical top-to-bottom direction through the distribution part into the reaction space of the reaction chamber (as indicated by arrows 103). In the reaction space the precursor vapor enters in a vertical direction in between the substrates 170 placed in the substrate holder in a vertical position. In the intermediate space between substrates 170 the precursor flow reacts with reactive sites on substrate surfaces. The precursor flow goes in a vertical direction along the substrate surfaces towards the exhaust guide 150. Reaction by-products and remaining precursor molecules are purged out from the reaction chamber in a subsequent purge step (as indicated by arrows 104).

The temperature of the reaction space can be controlled by heater element(s). According to an embodiment, the heating of the reaction space is arranged by one or more resistors 1301. In an embodiment, the heat resistor(s) 1301 are electrically heated. They can be wired to a computer-controlled power source (not shown).

Figure 14:
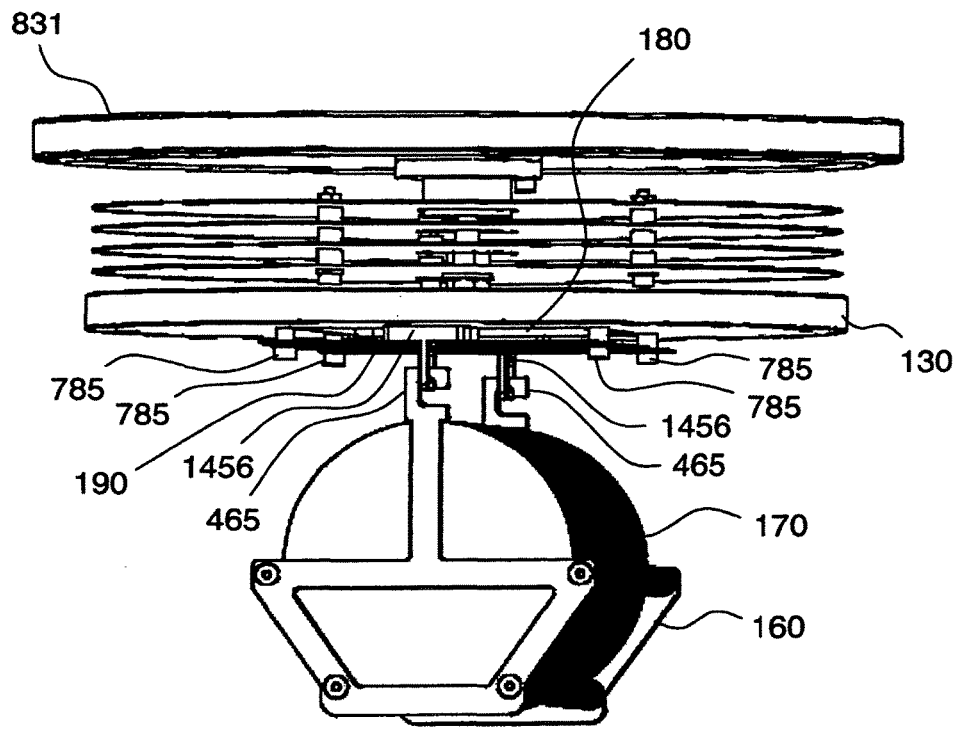
FIG. 14 shows in more detail a substrate holder attachment to a reaction chamber lid in accordance with an embodiment.

FIG. 14 shows in more detail a substrate holder attachment to a reaction chamber lid in accordance with an embodiment. The substrate holder 160 is attached with its top attachment part or hook(s) 465 to a counterpart 1456 in the lid system. The distribution part 190 is attached to the lid system with spacer pins 785.

Figure 15:
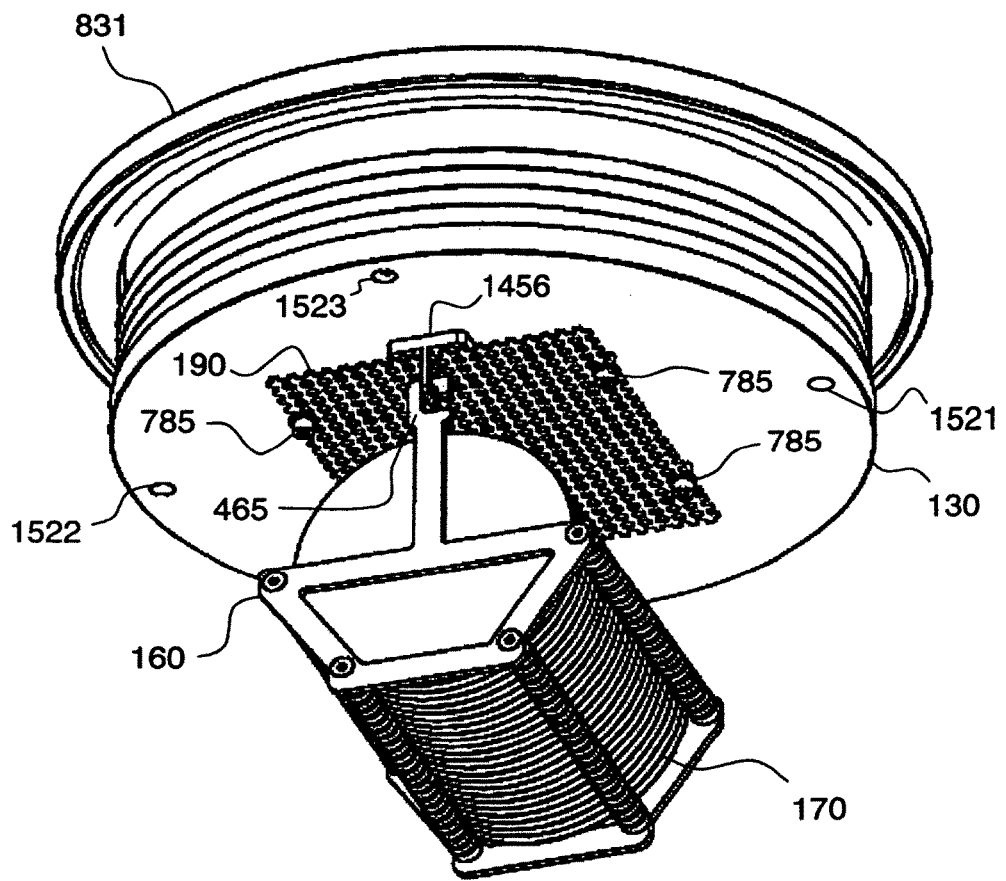
FIG. 15 shows another view of the drawing presented in FIG. 14.

FIG. 15 shows yet another view of the drawing presented in FIG. 14. Visible are the distribution part 190 and the holes 1521-1523 in the reaction chamber lid 130 for in-feed lines 141-143, respectively, via which precursor or inactive purge gas flow enters the reaction chamber lid 130. The number of the holes in the reaction chamber lid 130 and the number of the related in-feed lines varies typically from 2 to 4 or even greater number capable of receiving source chemical vapour from 2 or more source systems being in computer-controlled fluid communication with the said in-feed lines.

The following presents an example of depositing thin film on a substrate batch (reference is made to FIGS. 1-15 described in the preceding):

The reaction chamber was first pressurized to room pressure. The reaction chamber lid 130 was lifted with a lifting mechanism (not shown) to an upper position exposing the internal space of the reaction chamber. The lifting mechanism was operated with a pneumatic elevator. In other embodiments a stepper motor can be utilized for the lifting mechanism. The substrate holder 160 loaded with a number of substrates was lowered with a lifting part 465 within the reaction chamber body 110. The reaction chamber lid 130 was lowered with the lifting mechanism to a lower position sealing the reaction chamber. At the same time the surrounding vacuum chamber 805 was sealed against the room air with the movable vacuum chamber lid 831 in this dual lid system where the reaction chamber lid 130 was attached together with the vacuum chamber lid 831. The reaction chamber was then pumped with a vacuum source to vacuum. Inactive purge gas comprising nitrogen or argon flowed through the in-feed lines 141-143 to the conduits within the reaction chamber top flange 120 and further into the reaction space. The combination of pumping with a vacuum source and purging with inactive gas stabilized the pressure of the reaction space preferably to approximately 1-5 hPa absolute. The temperature of the substrate holder 160 was stabilized to a deposition temperature. In this example the deposition temperature was +300° C. for growing aluminum oxide $Al_2O_3$ by ALD from trimethylaluminum TMA and water $H_2O$ vapors. TMA source (not shown) was in computer-controlled fluid communication with the first in-feed line 141. $H_2O$ source (not shown) was in computer-controlled fluid communication with the second in-feed line 142. The third in-feed line 143 was reserved for a third chemical source. In this example the in-feed line was used only for inactive purge gas. When the programmed deposition temperature had been reached, deposition sequence was activated with the automated control system. During pulse A period TMA vapor was introduced with an automated pulsing valve (not shown) into the first in-feed line 141 and pushed with inactive carrier gas comprising nitrogen gas (in other embodiments argon gas is also suitable) into the reaction space where TMA molecules chemisorbed on all heated surfaces within the reaction space. Substrate surfaces typically became saturated with TMA molecules or ligand-deficient species generated from TMA molecules in about 0.05-1 s depending on the size of the substrate batch. After that the TMA source was isolated with the first automated pulsing valve from the first in-feed line 141 and the system commenced purge A period. Inactive purge gas then flowing through in-feed lines 141-143 pushed residual gaseous TMA molecules and surface reaction by-products from the reaction chamber to the exhaust guide 150 and further towards the vacuum source (not shown). Purge A period lasted typically about 1-10 s depending on the size of the substrate batch. Next, during pulse B period $H_2O$ vapor was introduced with an automated pulsing valve (not shown) into the second in-feed line 142 and pushed with inactive carrier gas comprising nitrogen or argon gas into the reaction space where $H_2O$ molecules chemisorbed on all heated surfaces within the reaction space. Substrate surface typically become saturated with OH-ligands in about 0.05-2 s depending on the size of the substrate batch. Then, in the beginning of the purge B period the $H_2O$ source was isolated with the second automated pulsing valve from the second in-feed line 142. Inactive gas then flowing through in-feed lines 141-143 into the reaction chamber pushed residual gaseous $H_2O$ molecules and surface reaction products from the reaction chamber to the exhaust guide 150 and further towards the vacuum source (not shown). These four steps (pulse A, purge A, pulse B and purge B) generated 1 Å of new OH-terminated $Al_2O_3$ thin film on substrates surfaces. Automated pulsing sequence repeated these four steps 500 times resulting in the growth of 50 nm of $Al_2O_3$ thin film with excellent 1% non-uniformity over 25 pieces of 100 mm silicon wafers. After completing the sequence of pulsing source chemicals and purging the reaction chamber, the reaction chamber was pressurized to room pressure, and the lids (vacuum chamber lid 831 and reaction chamber lid 130) were lifted to upper position exposing the internal space of the reaction chamber housing the substrate batch. The substrate holder 160 having a number of substrates (not shown) was unloaded with a lifting part 465 from the reaction chamber body 110 and placed to a separate cooling table (not shown).

Various embodiments have been presented. It should be appreciated that in this document, words comprise, include and contain are each used as open-ended expressions with no intended exclusivity.

The foregoing description has provided by way of non-limiting examples of particular implementations and embodiments of the invention a full and informative description of the best mode presently contemplated by the inventors for carrying out the invention. It is however clear to a person skilled in the art that the invention is not restricted to details of the embodiments presented above, but that it can be implemented in other embodiments using equivalent means without deviating from the characteristics of the invention.

Furthermore, some of the features of the above-disclosed embodiments of this invention may be used to advantage without the corresponding use of other features. As such, the foregoing description should be considered as merely illustrative of the principles of the present invention, and not in limitation thereof. Hence, the scope of the invention is only restricted by the appended patent claims.

The invention claimed is:

1. A method comprising:
   loading an atomic layer deposition reactor by carrying a horizontal stack of vertically oriented substrates by a substrate holder, and subsequently attaching the substrate holder with the stack of vertically oriented substrates carried therein to an attachment part hanging from a reaction chamber lid of the reactor, where the attachment part hanging from the lid positions the substrate holder with the stack of vertically oriented substrate into a predetermined position, and lowering the reaction chamber lid together with the attached substrate holder carrying the stack of vertically oriented substrates into a reaction chamber of the atomic layer deposition reactor the lid thereby closing the reaction chamber so as to form a reaction space within the reaction chamber;
   depositing material on surfaces of the stack of vertically oriented substrates in the formed reaction space while the substrate holder remains attached to the attachment part hanging from the reaction chamber lid by performing in vacuum at least one atomic layer deposition cycle comprising establishing a vertical top to bottom flow of precursor gas so that precursor gas flows from an upper side of the reaction space to an exhaust guide at a bottom side of the reaction space essentially in said top to bottom direction; and
   opening said reaction chamber by lifting the reaction chamber lid together with the attached substrate holder carrying the stack of vertically oriented substrates from the reaction chamber; and
   detaching the substrate holder with the stack of vertically oriented substrates carried therein from the attachment part hanging from the reaction chamber lid,
   wherein the substrate holder is freely suspended from the attachment part by two hooks located on opposite sides of the substrate holder.

2. The method of claim 1, comprising lowering the reaction chamber lid together with the attached substrate holder carrying the stack of vertically oriented substrates into the reaction chamber so that the substrate holder carrying the stack of vertically oriented substrates extends to a bottom portion of the reaction chamber, the substrate holder together with the stack of vertically oriented substrates being conformal to the shape of the bottom portion of the reaction chamber.

3. The method of claim 1, comprising lowering the reaction chamber lid together with the attached substrate holder carrying the stack of vertically oriented substrates into a reaction chamber having a rectangular horizontal cross section.

4. The method of claim 1, comprising lowering the reaction chamber lid together with the attached substrate holder carrying the stack of vertically oriented substrates into a reaction chamber having a rectangular horizontal cross section and a bottom structure having a U-shaped vertical cross section.

5. The method of claim 4, comprising lowering the reaction chamber lid together with the attached substrate holder carrying the stack of vertically oriented substrates into the reaction chamber so that the substrate holder carrying the stack of vertically oriented substrates extends to a curved portion of the reaction chamber having the U-shaped vertical cross section, the substrate holder together with the stack of vertically oriented substrates being conformal to the bottom structure and the rectangular horizontal cross section of the reaction chamber.

6. The method of claim 4, comprising guiding the flow of precursor gas to the exhaust guide at the bottom side of the reaction space by the bottom structure having a U-shaped vertical cross section.

7. The method of claim 1, comprising lowering the reaction chamber lid together with the attached substrate holder carrying the stack of vertically oriented substrates into the reaction chamber so that the substrate holder carrying the stack of vertically oriented substrates extends to a bottom portion of the reaction chamber, the substrate holder together with the stack of vertically oriented substrates filling the bottom portion of the reaction chamber without touching the inner wall of the reaction chamber.

8. The method of claim 1, comprising attaching the substrate holder with the stack of vertically oriented substrates carried therein to an attachment part hanging from a combined lid system containing both the reaction chamber lid and a lid to a vacuum chamber that surrounds the reaction chamber, and lowering the lid system together with the attached substrate holder carrying the stack of vertically oriented substrates into the reaction chamber; and forming a reaction space in the reaction chamber by pressing the lid system, the reaction chamber lid being pressed against a reaction chamber top flange and the lid to the vacuum chamber sealing the vacuum chamber surrounding the reaction chamber.

9. The method of claim 1, comprising depositing material on surfaces of the stack of vertically oriented substrates in the formed reaction space without rotating the horizontal stack of vertically oriented substrates.

10. The method of claim 1, the loading being performed without providing planar surfaces against the vertical top to bottom flow of precursor gas.

11. An apparatus, wherein the apparatus is an atomic layer deposition reactor comprising:

a substrate holder configured to carry therein a horizontal stack of vertically oriented substrates, an attachment part to which the substrate holder is configured to be attached and from which the substrate holder is configured to be detached, the attachment part hanging from a reaction chamber lid of the reactor, where the attachment part hanging from the lid is configured to position the substrate holder with the stack of vertically oriented substrates into a predetermined position, the apparatus being configured to perform a loading step of carrying a horizontal stack of vertically oriented substrates by the substrate holder, and subsequently attaching the substrate holder with the stack of vertically oriented substrates carried therein to the attachment part hanging from the reaction chamber lid, a lifting mechanism configured to lower and lift the reaction chamber lid together with the attached substrate holder carrying the stack of vertically oriented substrates, a top loading reaction chamber configured to receive the substrate holder, with the horizontal stack of vertically oriented substrates carried therein, attached to the attachment part hanging from the reaction chamber lid, the reaction chamber lid being configured to close the reaction chamber so as to form a reaction space within the reaction chamber, a first in-feed line configured to feed from an upper side of the reaction chamber a first precursor gas to the reaction chamber and at least a second in-feed line separate from the first in-feed line configured to feed from an upper side of the reaction chamber a second precursor gas to the reaction chamber and an exhaust guide at a bottom side of the reaction chamber so as to provide the reaction chamber with alternating vertical top to bottom flows of a first precursor gas and at least a second precursor gas, and a vacuum pump in fluid connection with the reaction chamber, the apparatus being configured to deposit material on surfaces of the stack of vertically oriented substrates by performing in vacuum at least one atomic layer deposition cycle while the substrate holder with the horizontal stack of vertically oriented substrates carried therein remains attached to the reaction chamber lid, wherein the substrate holder is freely suspended from the attachment part by two hooks located on opposite sides of the substrate holder.

12. The apparatus of claim 11, the substrate holder being configured to extend to a bottom portion of the reaction chamber when the reaction chamber lid closes the reaction chamber, and the substrate holder together with the stack of vertically oriented substrates being conformal to the shape of the bottom portion of the reaction chamber.

13. The apparatus of claim 11, the reaction chamber having a rectangular horizontal cross section.

14. The apparatus of claim 11, the reaction chamber having a rectangular horizontal cross section and a bottom structure having a U-shaped vertical cross section.

15. The apparatus of claim 14, the substrate holder being configured to extend to a curved portion of the reaction chamber having the U-shaped vertical cross section when the reaction chamber lid closes the reaction chamber, and the substrate holder together with the stack of vertically oriented substrates being conformal to the bottom structure and the rectangular horizontal cross section of the reaction chamber.

16. The apparatus of claim 11, the apparatus comprising a vacuum chamber surrounding the reaction chamber and the reaction chamber lid being a part of a combined lid system containing both the reaction chamber lid and a lid to the vacuum chamber surrounding the reaction chamber, the lid to the vacuum chamber being configured to seal the vacuum chamber surrounding the reaction chamber when the reaction chamber lid is pressed against a reaction chamber top flange.

17. The apparatus of claim 11, the reaction chamber and substrate holder being separate physical entities.

18. The apparatus of claim 11, the substrate holder comprising a substrate supporting portion having an upper horizontal cross section area larger than a lower horizontal cross section area.

19. The apparatus of claim 11, the substrate holder being configured to extend to a bottom portion of the reaction chamber when the reaction chamber lid closes the reaction chamber, and the substrate holder together with the stack of vertically oriented substrates filling the bottom portion of the reaction chamber without touching the inner wall of the reaction chamber when the reaction chamber lid closes the reaction chamber.

20. The apparatus of claim 11, the apparatus being configured to perform the loading step without providing planar surfaces against the vertical top to bottom flow of precursor gas.

* * * * *